United States Patent [19]
Ikoma

[11] Patent Number: 6,005,881
[45] Date of Patent: Dec. 21, 1999

[54] SEMICONDUCTOR LASER AND METHOD OF MAKING THE SAME

[75] Inventor: Nobuyuki Ikoma, Yokohama, Japan

[73] Assignee: Sumitomo Electric Industries, Ltd., Osaka, Japan

[21] Appl. No.: 08/998,827

[22] Filed: Dec. 29, 1997

[30] Foreign Application Priority Data

Jan. 7, 1997 [JP] Japan ..................................... 9-000730

[51] Int. Cl.$^6$ .............................. H01S 3/19; H01L 21/20
[52] U.S. Cl. ................................. 372/46; 372/43; 372/44; 372/45; 372/49; 372/50; 437/129; 437/51; 437/20
[58] Field of Search ................................ 372/43, 44, 45, 372/46, 49, 50; 437/129, 51, 141, 20, 21

[56] References Cited

U.S. PATENT DOCUMENTS

| | | |
|---|---|---|
| 4,845,725 | 7/1989 | Welch et al. ............................... 372/46 |
| 5,469,457 | 11/1995 | Nagai et al. ............................... 372/45 |
| 5,573,976 | 11/1996 | Kato et al. ............................... 437/129 |
| 5,574,741 | 11/1996 | Arimoto ..................................... 372/45 |
| 5,737,351 | 4/1998 | Ono .......................................... 372/45 |
| 5,764,669 | 6/1998 | Nagai ........................................ 372/45 |
| 5,781,577 | 7/1998 | Nagai et al. ............................... 372/46 |
| 5,825,797 | 10/1998 | Nagai ........................................ 372/46 |

FOREIGN PATENT DOCUMENTS

| | | | |
|---|---|---|---|
| 660380 | 6/1995 | European Pat. Off. ............. | 372/46 X |
| 19610352 | 10/1996 | Germany ............................. | 372/46 X |
| 63-056979 | 3/1988 | Japan .................................... | 372/46 X |
| 63-196088 | 8/1988 | Japan .................................... | 372/45 X |
| 3-116795 | 5/1991 | Japan .................................... | 372/46 X |
| 7-058402 | 3/1995 | Japan .................................... | 372/45 X |
| 96/27226 | 9/1996 | WIPO ................................... | 372/46 X |

OTHER PUBLICATIONS

B. Elman, et al., "GaAs/AlGaAs Quantum–well Intermixing Using Shallow Rapid Thermal Annealing", J. Appl. Physics, vol. 66, No. 5, pp. 2104–2107, (Sep. 1, 1989).

*Primary Examiner*—Brian Healy
*Attorney, Agent, or Firm*—Smith, Gambrell & Russell, LLP

[57] ABSTRACT

The present invention relates to a semiconductor laser equipped with a novel window structure, thereby realizing higher output, and a method of making the same. The method is a method of making a semiconductor laser having a window structure transparent to emitted laser light. In particular, into a laminate structure comprising a semiconductor substrate, a lower cladding layer, an active layer, and an upper cladding layer, impurity atoms is implanted to a predetermined region of the upper cladding layer by ion implantation method, thereby forming an impurity implanted region above the active layer. Further, in this method, after the laminate structure is heat-treated to such an extent that the impurity atom fails to reach the active layer, the laminate structure is cleaved in the area where the impurity atom is implanted, thus yielding a semiconductor laser. As a result of such a heat treatment, the vacancies generated upon ion implantation diffuse into the active layer, whereas the impurity atoms themselves do not diffuse into the active layer. This vacancy diffusion forms, in the vicinity of the cleavage plane in the active layer, a window structure in which a well layer and barrier layers which constitute the quantum well structure are selectively interdiffused. This window structure suppresses the catastrophic optical damage during high output operation.

17 Claims, 11 Drawing Sheets

[110] DIRECTION

[1-10] DIRECTION

[110] DIRECTION

[1-10] DIRECTION

A [110] DIRECTION

[1-10] DIRECTION

[110] DIRECTION

[110] DIRECTION

SEMICONDUCTOR LASER AND METHOD OF MAKING THE SAME

BACKGROUND OF THE INVENTION

1. Field of the Invention

The present invention relates to a semiconductor laser in which at least one end of a resonator is equipped with a window structure and a method of making the same.

2. Related Background Art

There have been known semiconductor lasers in which, in order to attain higher output, a window structure transparent to laser light is provided near a light exit end of a resonator having a quantum well active layer, thereby preventing catastrophic optical damage (COD) at this light exit end facet.

For example, in the semiconductor laser disclosed in Japanese Patent Application Laid-Open No. 7-58402, impurities are introduced in the vicinity of a resonator facet of a Fabry-Perot type semiconductor laser having a quantum well structure, thereby forming a window structure. Namely, GaInP or AlGaInP crystal material is grown under a predetermined condition, thus forming an active layer with spontaneous ordering structure, and then impurities such as Zn are introduced into a light exit end region of the resonator having this active layer, thereby forming a window structure in which the spontaneous ordering structure is disordered. Since the bandgap of thus obtained window structure region becomes greater than that in a region which is not disordered, catastrophic optical damage (COD), which tends to occur during a high output operation of a semiconductor laser, is suppressed, thereby higher output is realized.

In the semiconductor laser having a window structure disclosed in U.S. Pat. No. 4,845,725, injected impurities (Si, Zn, and Sn) are diffused to an multiple-quantum well (MQW) active layer, so as to cause interdiffusion between well layers and barrier layers, thereby realizing a window structure having a greater bandgap in this part. Thus obtained window structure also functions as a transparent optical waveguide layer in which the guided mode of light gradually broadens, thereby minimizing the size of a far-field laser light image.

The semiconductor laser disclosed in Japanese Pat. Publication No. 6-48742 is an AlGaAs type semiconductor laser in which Zn is selectively diffused into an AlAs/GaAs superlattice active layer, thereby the superlattice structure is totally disordered. The bandgap of this disordered region becomes greater than that of the active layer without Zn-diffusion and the disordered region can be a window strcture.

Having studied the conventional semiconductor lasers, the inventors have found the following problems. Namely, known as the conventional semiconductor lasers are those of a type in which impurities are introduced so as to disorder a spontaneous ordering structure, thereby forming a window structure (Japanese Pat. Application Laid-Open No. 7-58402); and those of a type in which impurities are introduced so as to cause diffusion between the well layers and barrier layers in a quantum well layers, thereby forming a window structure (U.S. Pat. No. 4,845,725 and Japanese Pat. Publication No. 6-48742). In these semiconductor lasers, however, since impurities introduced in order to form a window structure exist in the window structure, light is absorbed by these impurities, and thereby the performance of the semiconductor lasers may be deteriorated. Also, due to such impurities, leak current tends to increase in the vicinity of the laser facet. Such leak current causes nonradiative recombination of carriers, and the energy caused by the nonradiative recombination accelerates chemical reactions such as oxidation. Consequently, the laser facets may be deteriorated, and COD may be occurred at the deteriorated facets. In the case where impurities are introduced by means of ion implantation, crystals may be damaged by the implantation, which causes reliability of the laser to deteriorate.

SUMMARY OF THE INVENTION

In view of the above-described problems, the present inventors have conduced intensive studies. As a result, it is an object of the present invention to provide a semiconductor laser having a novel configuration which can realize higher reliability, higher output, and the like by incorporating therein a window structure different from those of the above-mentioned conventional semiconductor lasers; and a method of making the same.

The semiconductor laser according to the present invention is a semiconductor laser having a window structure transparent to emitted laser light. This window structure suppresses the catastrophic optical damage during high output operation. In particular, the semiconductor laser according to the present invention is equipped with a specific window structure. Initially, the method of making this semiconductor laser comprises a first step of growing, in succession, on a semiconductor substrate of a first conductivity type, a lower cladding layer of the first conductivity type, an active layer having a quantum well structure, and an upper cladding layer of a second conductivity type, so as to yield a laminate structure.

The active layer includes a quantum well structure containing at least one set of a laminate configuration in which a well layer is sandwiched between a pair of barrier layers. The upper cladding layer may comprise a first upper cladding sublayer which is disposed on the active layer in direct contact therewith and a second upper cladding sublayer disposed over the first upper cladding sublayer.

Into a predetermined area of the laminate structure obtained by the first step, impurity atoms such as nitrogen, for example, is selectively implanted by ion implantation method (second step). The impurity injection area implanted with the impurity atom extends from the laminate structure surface toward the active layer while being separated from the active layer by a predetermined distance.

In a third step, under a condition in which the impurity atom does not reach the active layer, the laminate structure is heat-treated (e.g., lamp-annealed), thereby forming a window structure. Namely, as a result of such a heat treatment, vacancies formed by the ion implantation diffuse into the active layer, whereas the impurity atoms themselves do not reach the active layer. Such diffusion of vacancies enhances atomic diffusion in vacancy-diffused region, thereby enhancing the interdiffusion between the well layer and barrier layers of the quantum- well structure near the impurity implanted region. As a result of the interdiffusion, the bandgap of the quantum well becomes wider.

Further, in a fourth step, at a position where the region implanted with the impurity atoms exists, the laminate structure is cleaved, thus yielding the semiconductor laser. Here, the cleavage plane becomes a light exit facet of the semiconductor laser.

The method according to the present invention may further comprise, between the third and fourth steps, a step of making a contact layer of the second conductivity type on the upper cladding layer excluding the impurity implanted region. Such a contact layer of the second conductivity type may be formed during a period between the first and second steps as well.

The semiconductor laser according to the present invention made by the foregoing method comprises a laminate structure having two cleavage planes that constitute a resonator. This laminate structure comprises, at least, a semiconductor substrate of a first conductivity type; a lower cladding layer of the first conductivity type disposed on or above the semiconductor substrate; an active layer which is disposed on the lower cladding layer and has a quantum well structure, in which a well layer and barrier layers which constitute the quantum well structure; and an upper cladding layer of a second conduction type disposed on the active layer. Also, in a predetermined region of the upper cladding layer (which may compose a first upper cladding sublayer and a second upper cladding sublayer), an impurity implanted region is formed by ion implantation method. This impurity implanted region includes a part of at least one of the cleavage planes while being separated from the active layerby a predetermined distance. In other words, the impurity implanted region extends from the surface of the upper cladding layer toward the active layer, while a predetermined distance separates the bottom part of the impurity implanted region from the active layer. Thus, since the impurity implanted in order to form the window structure does not exist in the active layer, this semiconductor laser is free from factors that may deteriorate laser characteristics such as laser light absorption.

The above-mentioned impurity atom includes nitrogen. The upper cladding layer is comprised of at least one of GaInP and AlGaInP. The well layer and barrier layer constituting the quantum well structure, and at least the well layer is comprised of GaInAs. In addition, a contact layer of the second conduction type is disposed on the upper cladding layer excluding the impurity implantation region.

In the semiconductor laser according to the present invention, of the upper cladding layer, a part excluding at least the impurity implanted region or a part excluding at least both the impurity implanted region and the region between the impurity implanted region and active layer has a spontaneous ordering structure.

As explained in the foregoing, in the semiconductor laser according to the present invention, the impurity atoms themselves do not diffuse into the active layer, whereas only vacancies diffuse therein. The diffusion of the vacancies causes selective interdiffusion between the well layer and barrier layers of the quantum well layer in a predetermined area of the active layer, thereby the bandgap of the active layer becomes wider. The resulting window structure suppresses the catastrophic optical damage during high output operation. As a result, a high output operation is secured for a long period of time.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
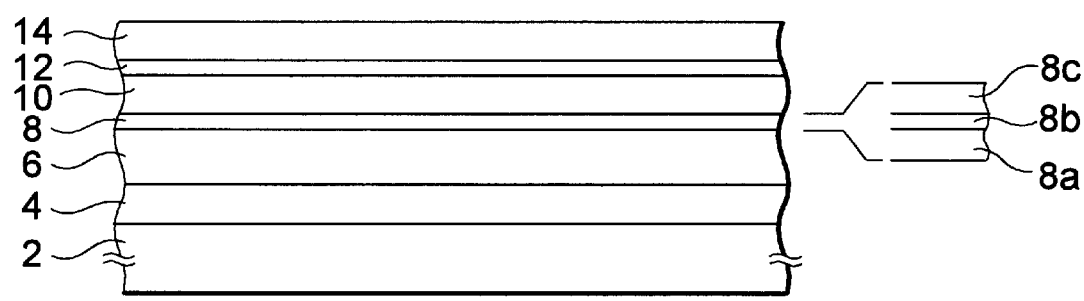
FIG. 1 is a sectional view showing a configuration of a GaAs laminate structure for forming a semiconductor laser according to the present invention.
Figure 2:
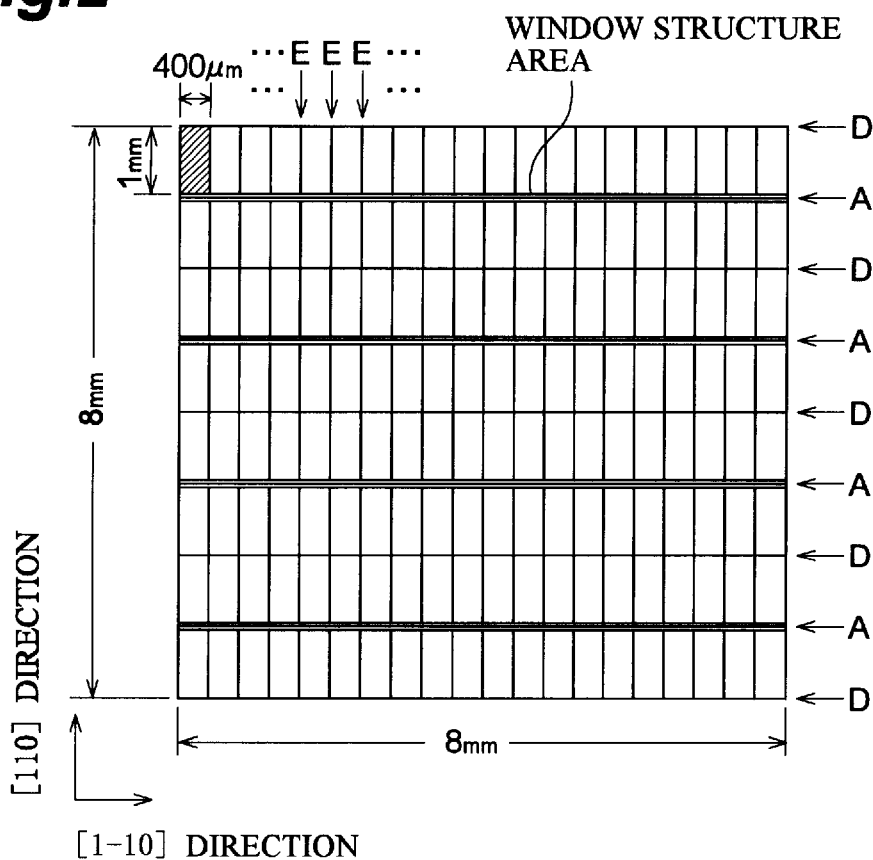
FIG. 2 is a plan view showing an arrangement of semiconductor laser chips for collectively manufacturing a plurality of semiconductor lasers by use of the GaAs laminate structure shown in FIG. 1.

In the following, embodiments of the semiconductor laser according to the present invention will be explained with reference to the accompanying drawings. FIG. 1 is a sectional view showing a GaAs laminate structure for forming the semiconductor laser according to the present invention; FIG. 2 is a plan view showing an arrangement for collectively manufacturing a plurality of semiconductor lasers in this GaAs laminate structure; and FIGS. 3 to 21 are views for explaining individual steps in the method of making the semiconductor laser according to the present invention. Here, FIGS. 6, 8, 10, 12, 14, 16, and 18 show vertical cross sections taken along line I—I in FIGS. 5, 7, 9, 11, 13, 15, and 17, respectively; whereas FIGS. 5, 7, 9, 11, 13, 15, and 17 show vertical cross sections taken along line II—II in FIGS. 6, 8, 10, 12, 14, 16, and 18, respectively.

Initially manufactured in the method of making the semiconductor laser according to the present invention is a GaAs laminate structure in which a predetermined semiconductor layer is grown on a Si-doped n-type GaAs substrate. A plurality of pieces of semiconductor laser chips are collectively formed in this GaAs laminate structure.

Namely, as shown in the sectional view of FIG. 1, on a GaAs(001) substrate 2 doped with Si (silicon), a Si-doped n-type GaAs buffer layer 4, a Si-doped n-type GaInP lower cladding layer 6, a quantum well active layer 8, a Zn—(zinc—) doped p-type GaInP first upper cladding sublayer 10, a Zn-doped p-type GaAs etch stop layer 12, and a Zn-doped p-type GaInP second upper cladding sublayer 14 are successively grown by organometaric vapor phase epitaxy method (hereinafter referred to as OMVPE method), thereby yielding a GaAs laminate structure. In this embodiment, the first and second upper cladding sublayers constitute an upper cladding layer. Further, in the quantum well active layer 8, three layers composed of an undoped GaInAsP layer (barrier layer) 8a, an undoped InGaAs layer (well layer) 8b, and an undoped GaInAsP layer (barrier layer) 8c materialize one set of quantum well structure. Growth conditions of the p-type GaInP first upper cladding sublayer 10 and the p-type GaInP second upper cladding sublayer 14 are set such that they form a spontaneous ordering structure.

The film thickness values of the n-type GaAs buffer layer 4, n-type GaInP cladding layer 6, GaInAsP layer 8a, GaInAs layer 8b, GaInAsP layer 8c, p-type GaInP first upper cladding sublayer 10, p-type GaAs etch stop layer 12, and p-type GaInP second upper cladding sublayer 14 are set to 0.2 μm, 1.5 μm, 47 nm, 8 nm, 47 nm, 0.6 μm, 5 nm, and 0.9 μm, respectively.

By use of the GaAs laminate structure having such a configuration, 160 pieces in total of semiconductor lasers each having a size of 400 μm (width)×1 mm (length) are collectively formed within a square area of 8 mm×8 mm as shown in the chip arrangement diagram of FIG. 2. The resonator of each semiconductor laser is formed along the [110] direction of the GaAs substrate. One side of each resonator (line indicated by arrow A in the drawing) is provided with a light exit facet having a window structure, whereas the other side thereof (line indicated by arrow D in the drawing) is provided with a reflective facet. As the GaAs laminate structure is cleaved along the lines indicated by arrows A, D, and E, a plurality of chips of semiconductor lasers are obtained.

Figure 3:
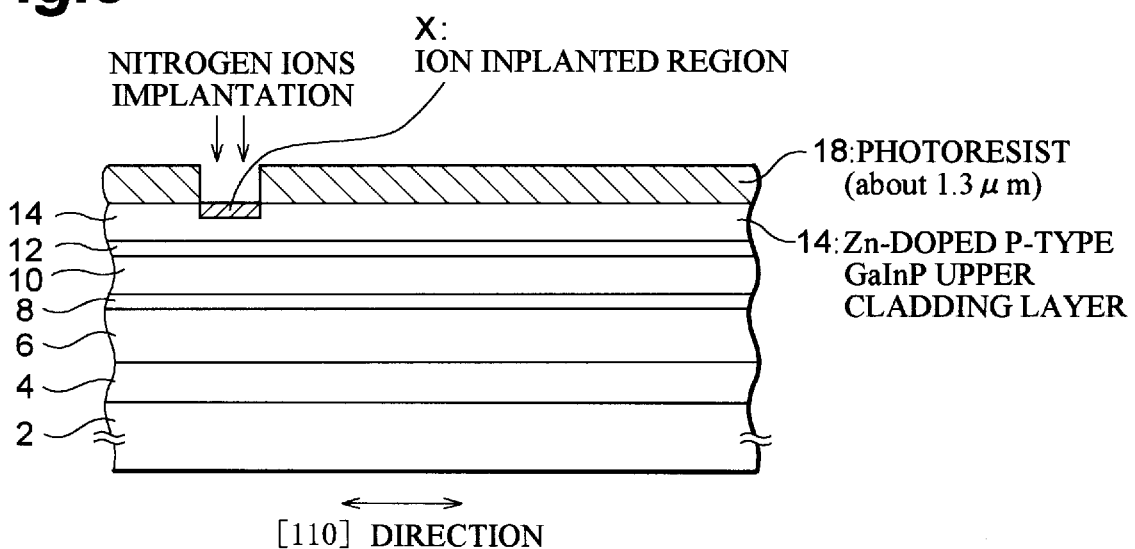
FIG. 3 is a view for explaining an ion implantation step for forming a window structure in a method of making the semiconductor laser according to the present invention.

In the following, with reference to FIGS. 3 to 21, individual steps in the method of making the semiconductor laser according to the present invention will be explained in detail. In FIG. 3, a photoresist 18 having a thickness of about 1.3 μm is coated on the surface of the p-type GaInP second upper cladding sublayer 14 of the GaAs laminate structure.

Further, patterning is performed such that the resist in an area for forming a window structure is removed by a width of 40 μm along the [1–10] direction. Here, the window structure is formed by the width of pre-set value 40 μm since cleavage positions are hard to accurately control when a laser exit facet is formed in a cleaving step that will be explained later. Namely, this width is set in view of deviations in the cleavage positions. While this photoresist 18 is used as a mask, N (nitrogen) ions are implanted into an area for forming a window structure, thereby generating an ion implanted region (impurity implanted region) X. The ion implantation is performed under the condition where ion type is $^{14}N^+$, acceleration voltage is 150 keV, dose is $1\times10^{14}$ cm$^{-2}$, and tilt angle is 7°.

When the ion injection area X is formed under this condition, the range (Rp) of N ion becomes about 0.31 μm, whereby this N ion implantation introduces crystal defects, such as numerous vacancies, in a region of the p-type GaInP second upper cladding sublayer 14 nearly corresponding to the upper half thereof. On the other hand, the N ions stop at a depth of about 0.6 μm in the p-type GaInP second upper cladding sublayer 14, whereby thus formed ion implanted region X does not reach the p-type GaAs etch stop layer 12. Without being restricted to N ions, any ions may be implanted as long as vacancies can be introduced thereby. Nevertheless, N ions are implanted in this embodiment since these have been found preferable for forming a window structure as a result of various experiments.

Also, the ion implantation may be performed under any condition as long as vacancies are introduced so as to yield sufficient bandgap increased by enhancing the interdiffusion between the well layer and barrier layer in the quantum well near the ion implanted region during annealing under an applicable condition (details of which will be explained later), while the impurities are not implanted into the quantum well active layer and do not diffuse into the quantum well active layer even during this annealing process. Thus, the above-mentioned ion implantation condition is only one example, which is not restrictive.

Figure 4:
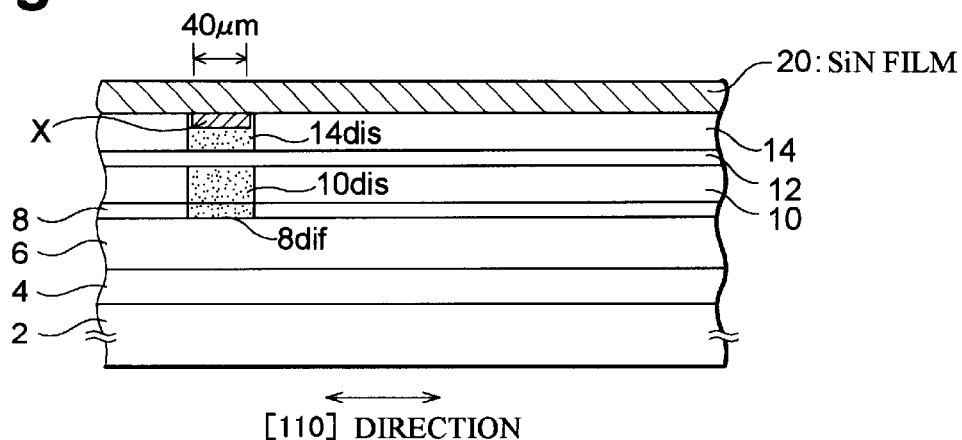
FIG. 4 is a view for explaining an annealing step for forming the window structure in the method of making the semiconductor laser according to the present invention.

Then, as shown in FIG. 4, after the photoresist 18 is removed, a SiN film 20 is deposited on the whole surface of the p-type GaInP second upper cladding sublayer 14 by plasma-chemical vapor deposition(p-CVD)method. While the SiN film 20 is used as a protective film against As deposition, a heat treatment is performed for 15 seconds at a temperature of 850° C. by lamp-annealing method. Since this heat treatment is rapid thermal annealing, N ions in the ion implanted region X slightly diffuse, but not so much to diffuse into the p-type GaAs etch stop layer 12. By contrast, vacancies having a higher diffusion velocity easily diffuse, thereby selectively enhancing the diffusion in the vicinity of the region where vacancies are introduced by the N-ion implantation. Consequently, the selective interdiffusion occurs between the GaInAs well layer and GaInAsP barrier layers of the quantum well active layer 8 only under the ion implanted region X. As a result, the bandgap of this region 8dif increases by about 50 meV. The diffusion of P from the barrier layers toward the well layer most contribute to increasing if this bandgap. Then, this region 8dif with an enhanced bandgap becomes a window structure. In the p-type GaInP upper cladding sublayers 10 and 14 at a region including the ion implanted region X, on the other hand, a spontaneous ordering structure is disordered by the diffusion of vacancies, whereby their bandgap increases by 50 meV.

As for annealing, it is preferred that the following three conditions satisfied:

(1) in order to form a window structure the bandgap is sufficiently increasedby enhancingthe interdiffusion between the well layer and barrier layers of the quantum well layer under the ion implanted region;

(2) there is no structure change which may deteriorate the performance and reliability of the laser in the region other than the vicinity of the ion implanted region; and (3) damages in the crystal caused by ion implanted region restored.

The present invention satisfies the first and second conditions, whereas the third condition can be managed under an annealing condition where damages may remain to such an extent that they do not adversely affect the semiconductor laser performance. Namely, the structure may be such that the damages are not enlarged when the laser is under operation. When carrier caused by the driving current for the laser flow into a damaged area of a crystal, the degree of damage may be enhanced, though very slowly, by the energy of recombination of the carrier, and the damaged area increases. Consequently, characteristics of the semiconductor laser may deteriorate after long-term laser operation. By contrast, when the structure is such that no or little carrier flows into the damaged area, the damages can be suppressed.

Therefore, in this embodiment, within an area slightly broader than the area damaged by N ion implantation, there exists a region 14dis in which vacancies generated upon the N ion implantation are diffused by annealing, thereby disordering the spontaneous ordering and broadening the bandgap. In this region 14dis, since the forbidden bandwidth is broadened, carriers are restrained from flowing from the p-type GaInP second upper cladding sublayer 14 excluding this region 14dis. Namely, diffusion of carriers into the damaged region is suppressed. As mentioned above, the p-type GaInP first upper cladding sublayer 10 also contains a region 10dis in which the spontaneous ordering is disordered so as to broaden the bandgap. This region, however, is formed due to the fact that the same growth condition is used for the p-type GaInP first upper cladding sublayer 10 and p-type GaInP second upper cladding sublayer 14 in order to facilitate the growth condition setting at the time of the initial growth by OMVPE method. Forming the region 10dis is not a prerequisite for restraining carriers from diffusing into the damaged region.

Figure 5:
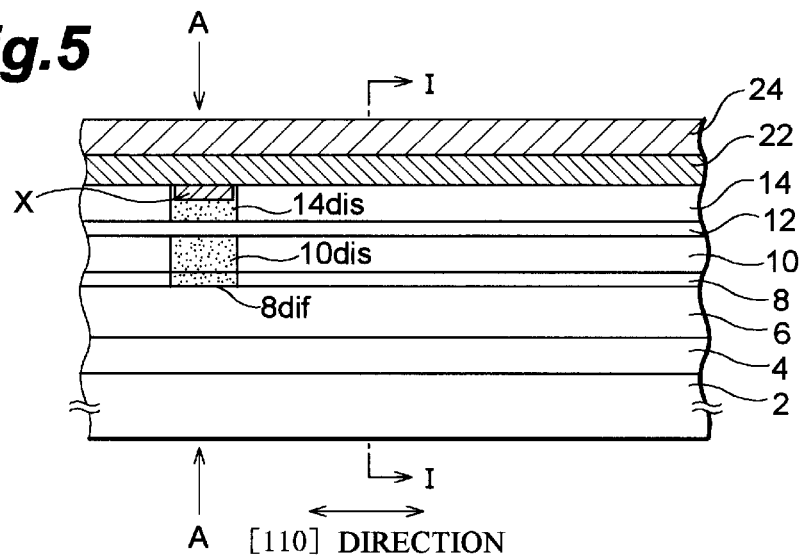
FIG. 5 is a view for explaining a step for forming a stripe structure in the method of making the semiconductor laser according to the present invention.
Figure 6:
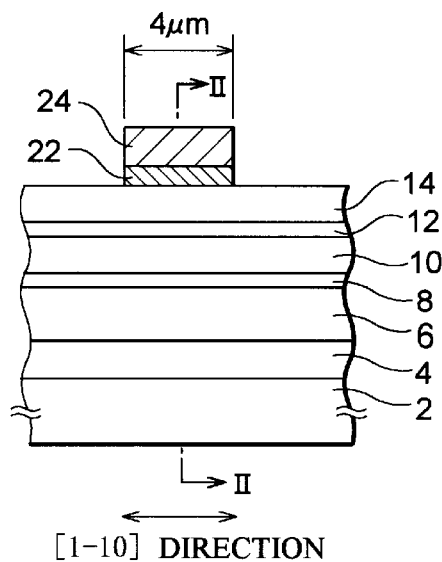
FIG. 6 is a sectional view of the GaAs laminate structure shown in FIG. 5, taken along line I—I.

Then, as shown in FIGS. 5 and 6, after the SiN film 20 is removed, another SiN film 22 is deposited on the surface of the p-type GaInP second upper cladding sublayer 14 again by p-CVD method. Further, a stripe-like photoresist layer 24 having a width of 4 μm is formed on the upper surface of the SiN film 22 along the [110] direction. Then, of the SiN film 22, the part other than the part provided with the resist layer 24 is etched.

Figure 7:
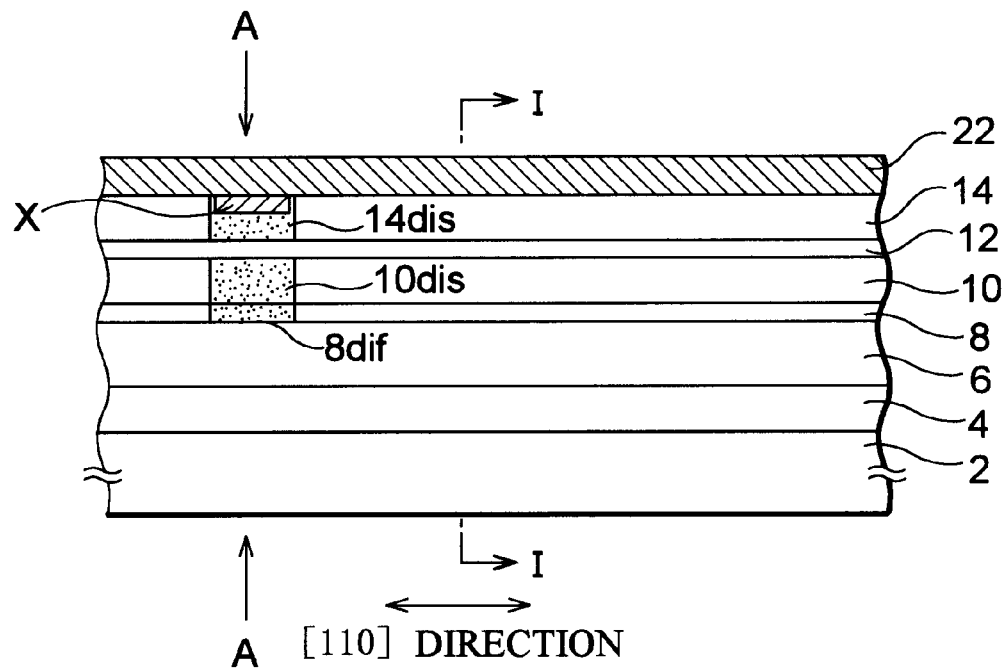
FIG. 7 is a view for further explaining the step for forming the stripe structure in the method of making the semiconductor laser according to the present invention.
Figure 8:
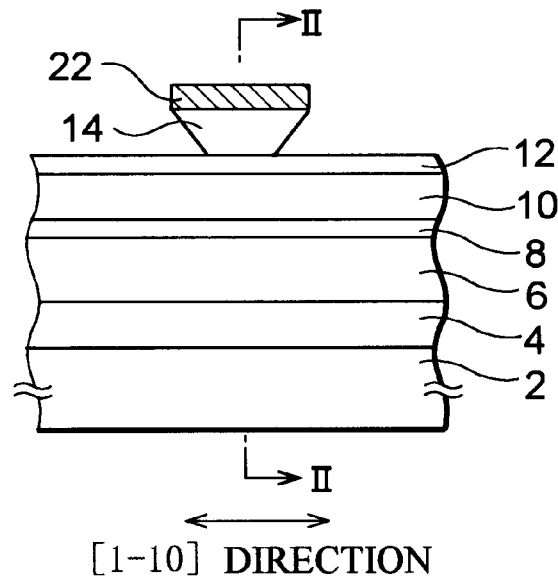
FIG. 8 is a sectional view of the GaAs laminate structure shown in FIG. 7, taken along line I—I.

Subsequently, as shown in FIGS. 7 and 8, after the photoresist layer 24 is removed, while the stripe-like SiN film 22 is used as a mask, the p-type GaInP second upper cladding sublayer 14 is selectively etched with a hydrochloric acid type etchant. Due to the selectivity of the hydrochloric acid type etchant, the etching automatically stops at the p-type GaAs etch stop layer 12. Further, due to the characteristics of the hydrochloric acid type etchant and GaInP crystal, the p-type GaInP second upper cladding sublayer 14 is etched into a rib-shaped form whose bottom width is narrower than top width.

Figure 9:
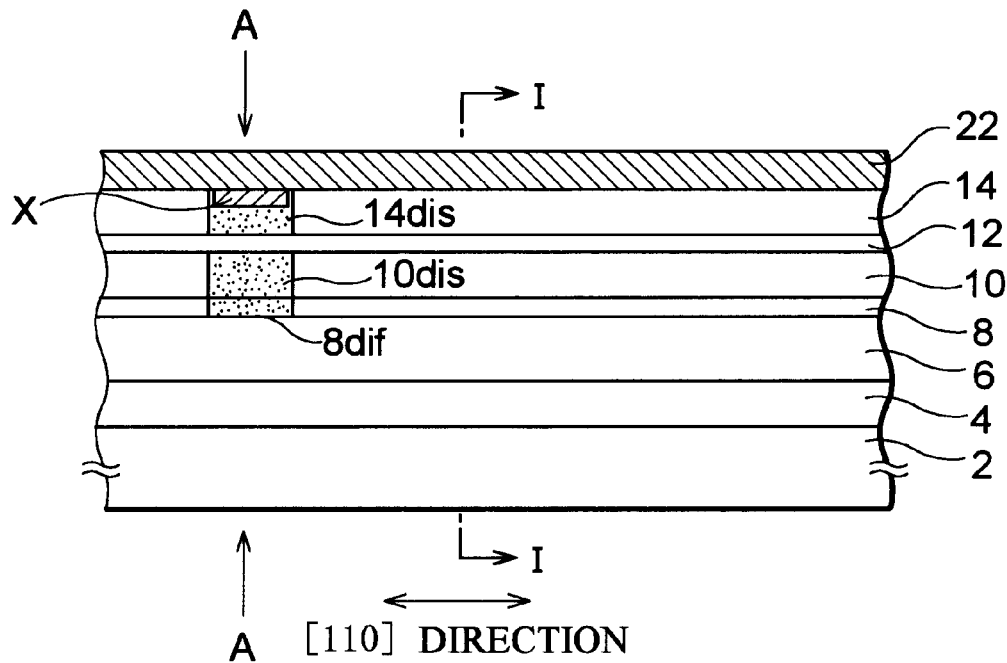
FIG. 9 is a view for explaining a burying and growing step in the method of making the semiconductor laser according to the present invention.
Figure 10:
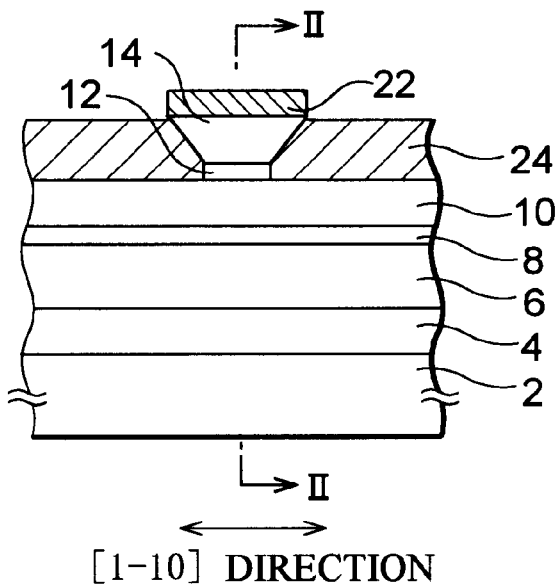
FIG. 10 is a sectional view of the GaAs laminate structure shown in FIG. 9, taken along line I—I.

Then, as shown in FIGS. 9 and 10, after the p-type GaAs etch stop layer 12 is selectively etched, an Si-doped n-type AlGaInP layer 24 for confining current into the stripe portion is formed on the p-type GaInP first upper cladding sublayer 10 in a burying manner by OMVPE method. This growth step is performed under a selective condition in which the n-type AlGaInP layer does not grow on the stripe-like SiN layer 22.

Figure 11:
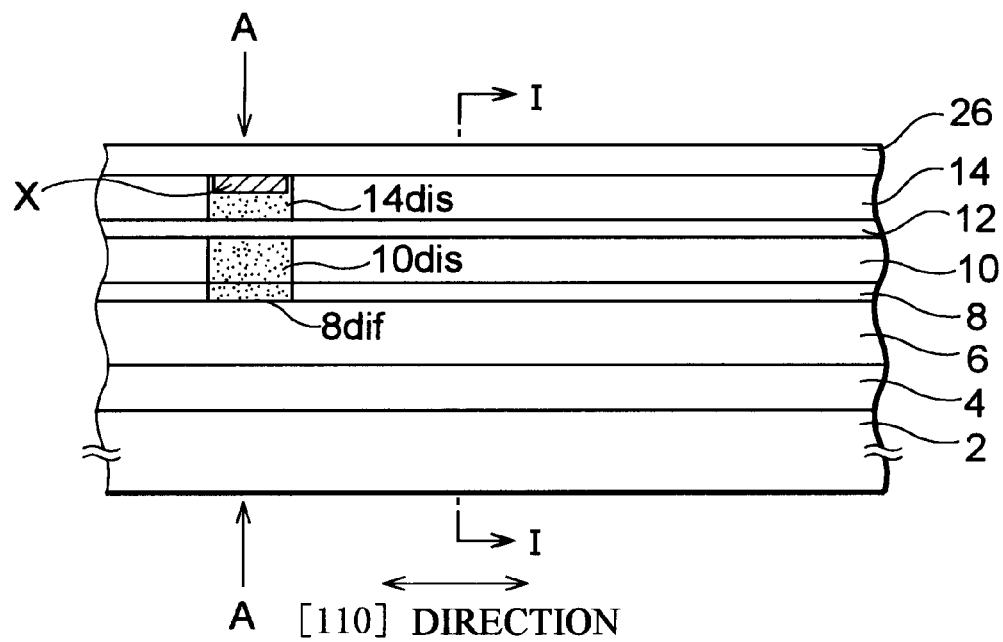
FIG. 11 is a view for explaining a step of forming a contact layer in the method of making the semiconductor laser according to the present invention.
Figure 12:
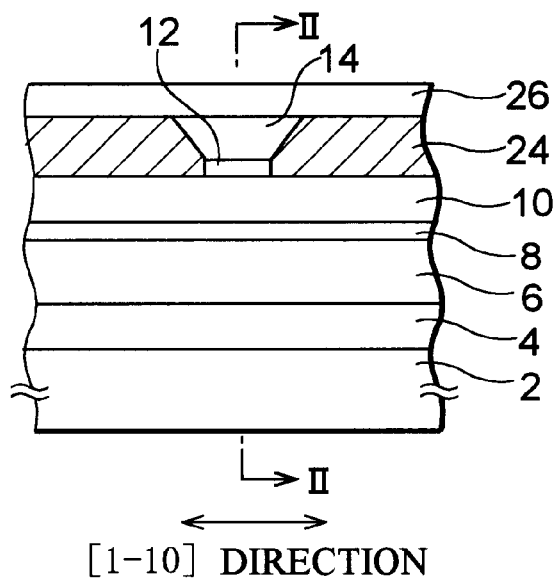
FIG. 12 is a sectional view of the GaAs laminate structure shown in FIG. 11, taken along line I—I.

Subsequently, as shown in FIGS. 11 and 12, after the stripe-like SiN layer 22 is removed, a Zn-doped GaAs contact layer 26 is formed on the p-type GaInP second upper cladding sublayer 14 and n-type AlGaInP layer 24 by OMVPE method.

Figure 13:
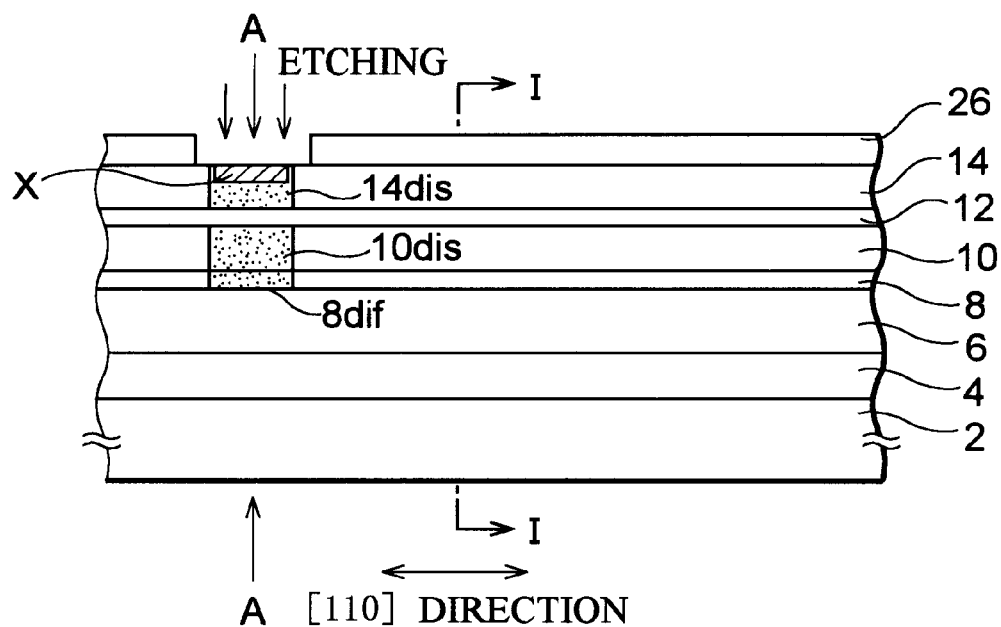
FIG. 13 is a view for explaining a step of removing the contact layer in the method of making the semiconductor laser according to the present invention.
Figure 14:
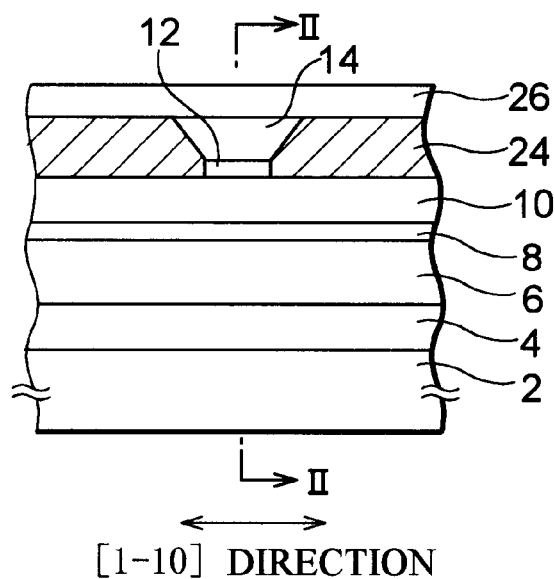
FIG. 14 is a sectional view of the GaAs laminate structure shown in FIG. 13, taken along line I—I.

Thereafter, as shown in FIGS. 13 and 14, of the p-type GaAs contact layer 26, the part extending by 30 μm each on both sides of the line indicated by arrow A in FIG. 2 above the window structure area is removed. Consequently, the contact layer 26 is removed above the area damaged upon implantation, whereby the carriers injected when the laser is under operation so as to prevent the current from flowing into the damaged area. Here, the contact layer is etched to an area separated from the damaged area by 10 μm in view of influences of positional deviations, since simple patterning method is employed at the time of the above-mentioned etching process. Thus, it is not prerequisite for the contact layer to be etched so as to be separated from the damaged area by 10 μm.

Figure 15:
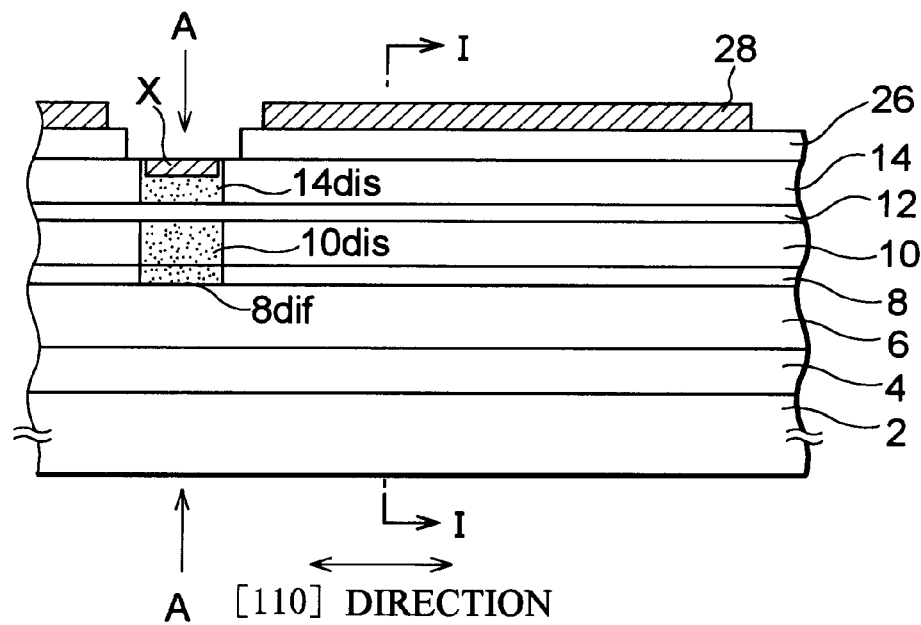
FIG. 15 is a view for explaining a step of forming a p-type electrode layer in the method of making the semiconductor laser according to the present invention.
Figure 16:
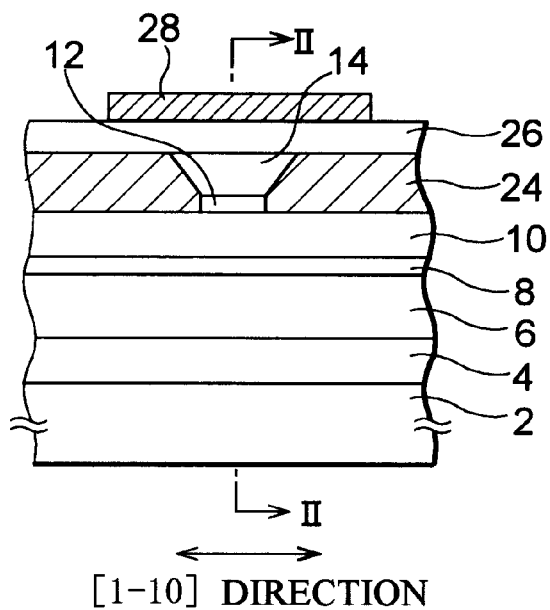
FIG. 16 is a sectional view of the GaAs laminate structure shown in FIG. 15, taken along line I—I.

Subsequently, as shown in FIGS. 15 and 16, a p-type electrode layer 28 comprising three layers of Ti/Pt/Au is deposited on the surface of the p-type GaAs contact layer 26. The thickness values of Ti, Pt, and Au are set to 100 nm, 100 nm, and 500 nm, respectively. Here, in order to facilitate cleavage, the p-type electrode layer 28 is formed so as to exclude areas in the vicinity of cleavage positions (the lines respectively indicated by arrows A, D, and E in FIG. 2).

Figure 17:
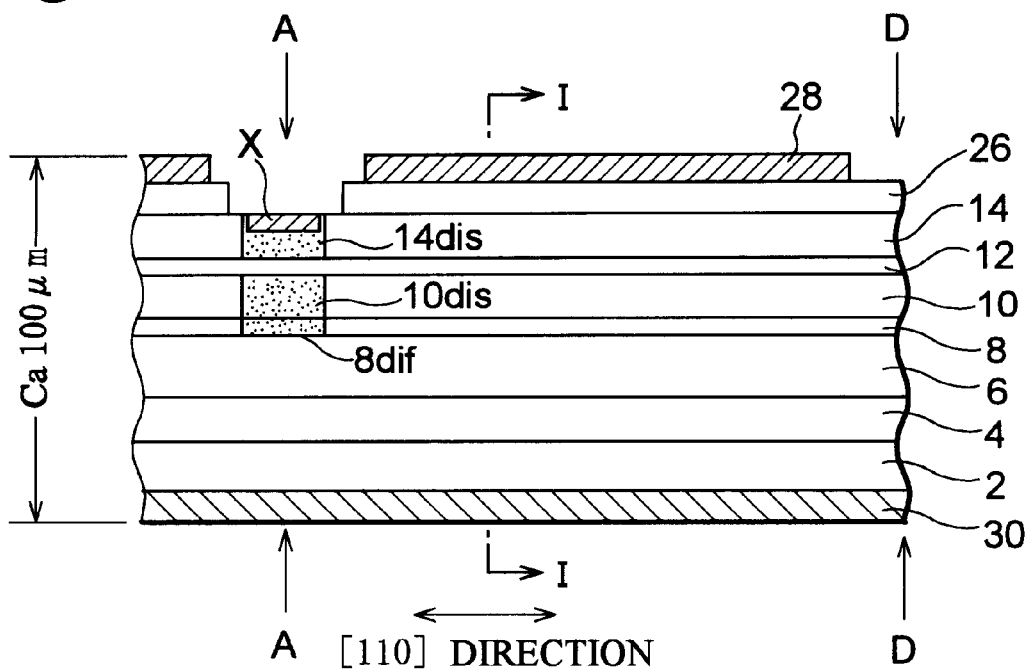
FIG. 17 is a view for explaining a step of forming an n-type electrode layer in the method of making the semiconductor laser according to the present invention.
Figure 18:
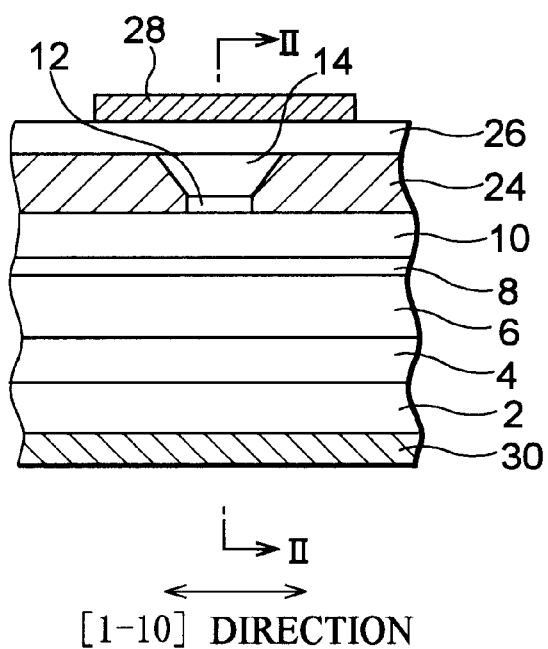
FIG. 18 is a sectional view of the GaAs laminate structure shown in FIG. 17, taken along line I—I.

Then, as shown in FIGS. 17 and 18, after the rear surface of the n-type GaAs substrate 2 is etched such that the whole thickness of the GaAs laminate structure becomes about 100 μm, an n-type electrode layer 30 comprising three layers of AuGe/Ni/Au is deposited on the rear surface of the n-type GaAs substrate 2. The thickness values of AuGe, Ni, and Au are set to 130 nm, 40 nm, and 500 nm, respectively. Thereafter, upon a heat treatment at a temperature of 360° C. for 60 seconds, the resistance value of each electrode part in the p-type electrode layer 28 and n-type electrode layer 30 is reduced.

Figure 19:
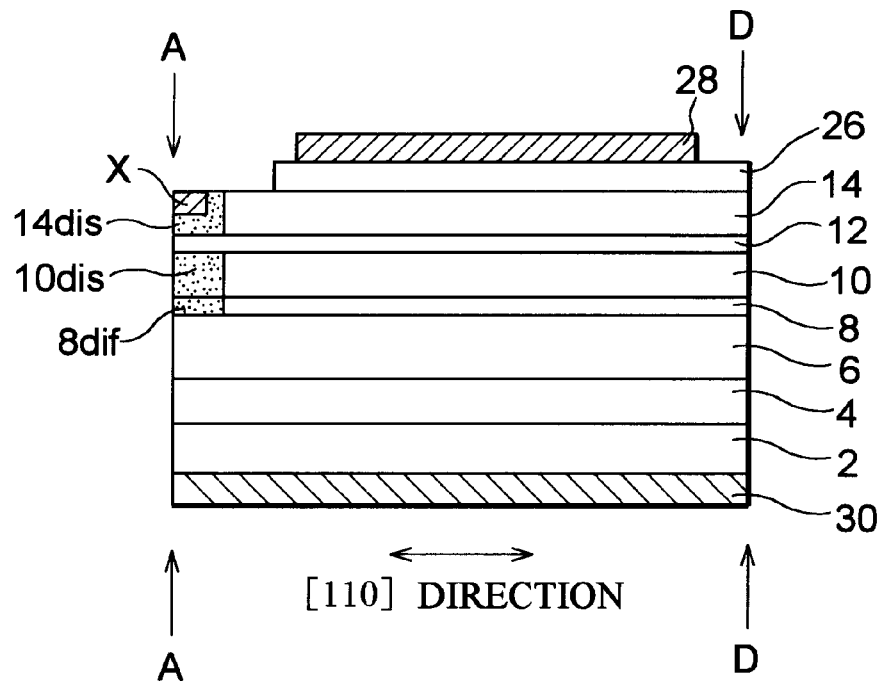
FIG. 19 is a view for explaining a cleaving step in the method of making the semiconductor laser according to the present invention.

Subsequently, after thus formed GaAs substrate is cut into a square of 8 mm×8 mm, as shown in FIG. 19, it is cleaved along the center portion of the area where the window structure is formed, i.e. along the line indicated by arrow A, in the [1–10] direction, whereby the resulting cleavage plane is obtained as a light exit facet of a resonator. Further, the resulting product is cleaved along the line indicated by arrow D in FIG. 2, thereby yielding a cleavage plane that becomes a reflective facet of the resonator. As a result of this cleavage processing, a window structure having a width of 20 μm is formed at each light exit facet, thus yielding 8 bars each containing 20 pieces of semiconductor lasers arranged in series in a lateral direction.

Figure 20:
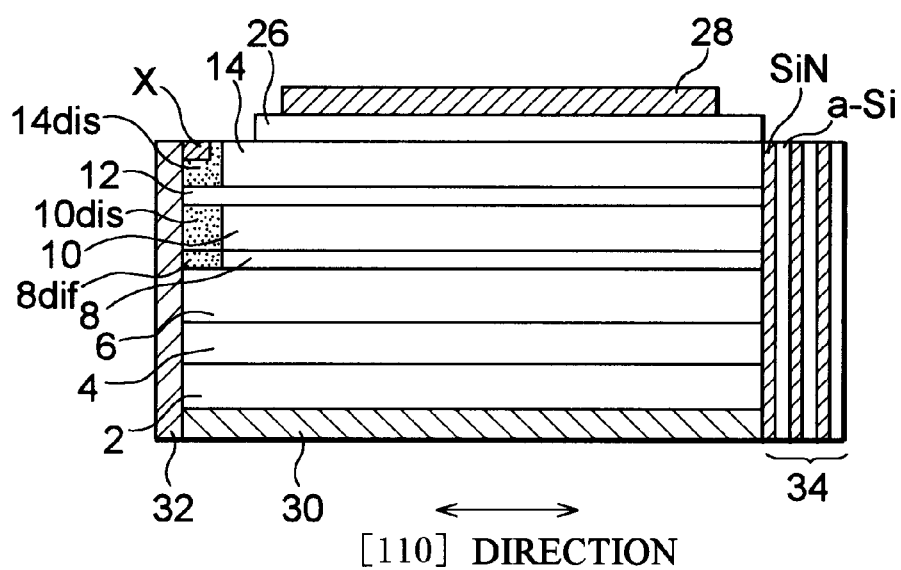
FIG. 20 is a view for explaining a step of coating a dielectric films in the method of making the semiconductor laser according to the present invention.

Then, as shown in FIG. 20, at the light exit facet of each bar, an SiN film 32, as an anti-reflective film (typical reflectivity is 3%), is deposited by electron cyclotron resonance-CVD (ECR-CVD) method. Further, on the opposite facet, three parts of SiN and amorphous Si (a-Si) films are deposited, thereby forming a high-reflectivity film 34 (typical reflectivity is 90%).

Figure 21:
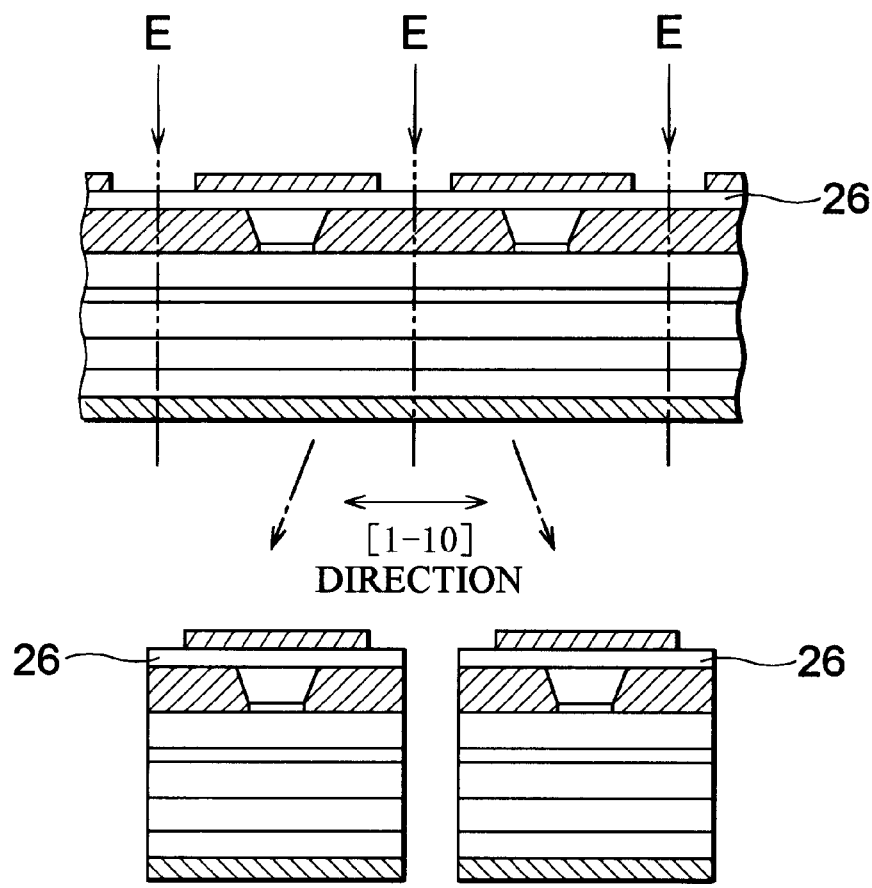
FIG. 21 is a view for explaining a cleaving step for forming discrete semiconductor lasers in the method of making the semiconductor laser according to the present invention.

Thereafter, as shown in FIG. 21, each bar is cleaved along the lines indicated by arrow E in FIG. 2 at intervals of 400 μm, thus yielding 20 pieces of semiconductor lasers equipped with a window structure from each bar.

Studies on characteristics of thus manufactured semiconductor lasers have revealed that they can continuously emit laser light having a wavelength of 980 nm. When characteristics of the semiconductor laser according to the present invention provided with a window structure by the foregoing manufacturing process were compared with those of a semiconductor laser (comparative sample) which had the same profile as that of the former semiconductor laser except that it had no window structure, their current/optical output characteristics, current/voltage characteristics, far-field patterns were found to be equivalent to each other. When these semiconductor lasers were subjected to a reliability comparison test, however, the semiconductor laser having a window structure according to the present invention was proved to be able to continuously operate at higher output for a longer period of time.

Namely, employed in this reliability comparison test is a method in which the supplied current is adjusted such that the optical output of each semiconductor laser is kept 150 mW while ambient temperature is held at 50° C. In 10 pieces of the comparative semiconductor lasers having no window structure, all the semiconductor lasers could not maintain the optical output of 150 mW after 400 hours of an aging test. By contrast, in the semiconductor lasers having a window structure according to the present invention, all the 10 pieces employed in the test could stably maintain the optical output of 150 mW even after 800 hours of the aging test, thus clearly proving the improved reliability of the semiconductor laser having a window structure according to the present invention.

In the method of making the semiconductor laser according to the present invention explained with reference to FIGS. 1 to 21, a novel window structure is formed by the ion implantation shown in FIG. 3 and the heat treatment shown in FIG. 4, and then the stripe configuration of semiconductor laser shown in FIGS. 5 to 10 is formed. Nevertheless, these processing steps may be performed in the reversed order. Namely, after forming the stripe configuration of semiconductor laser, the ion implantation and heat treatment may be performed so as to form the window structure. In the following, modified examples of this manufacturing method will be explained.

First Modified Example

In the first modified example, the ion implantation and heat treatment respectively shown in FIGS. 3 and 4 are omitted. Accordingly, in the steps shown in FIGS. 5 and 7, in the state where neither the ion implanted region X nor the regions 14dis, 10dis, and 8dif caused by the enhanced diffusion are formed, the stripe configurations of semiconductor laser shown in FIGS. 6 and 8 are formed, respectively.

After the stripe configuration shown in FIG. 8 is formed, appropriate lithography processing, ion implantation, and heat treatment are performed so as to form the ion implanted region X and regions 14dis, 10dis, and 8dif caused by the enhanced diffusion that are similar to those in the configuration shown in FIGS. 9 and 10. Also, after the SiN layer 22 is removed, patterning with a photoresist layer may be performed on the surface of the p-type GaInP second upper cladding sublayer 14, thus allowing the ion implantation and heat treatment processing to proceed in the area to be provided with a window structure. Alternatively, patterning with a photoresist layer may be performed on the surface of the SiN layer 22, thus allowing the ion implantation and heat treatment processing to proceed in the area to be provided with a window structure before the SiN layer 22 is eliminated.

After the ion implanted region X and the regions 14dis, 10dis, and 8dif caused by the enhanced diffusion are formed, the individual processing steps shown in FIGS. 11 to 21 are performed so as to collectively form a plurality of pieces of semiconductor laser chips.

Second Modified Example

In the second modified example, the ion implantation and heat treatment respectively shown in FIGS. 3 and 4 are omitted. Accordingly, in the steps shown in FIGS. 5, 7, and 9, in the state where the ion implanted region X and the regions 14dis, 10dis, and 8dif caused by the enhanced diffusion are not formed, the stripe configurations of semiconductor laser shown in FIGS. 6, 8, and 10 are formed, respectively.

After the stripe configuration shown in FIG. 10 is formed, appropriate lithography processing, ion implantation, and heat treatment are performed so as to form the ion implanted region X and regions 14dis, 10dis, and 8dif caused by thermal diffusion that are similar to those in the configuration shown in FIGS. 8 and 9. Namely, in the second modified example, after the p-type GaAs contact layer 26 is formed in FIGS. 11 and 12, under an appropriate lithography processing, N ions are implanted from the surface side of the contact layer 26 into the p-type GaInP second upper cladding sublayer 14 in the area to be provided with the window structure, thereby forming the ion implanted region X. Further, a heat treatment forms the regions 14dif, 10dis, and 8dif caused by the enhanced diffusion. After the ion implanted region X and the regions 14dis, 10dis, and 8dif caused by the enhanced diffusion are formed, the individual processing steps shown in FIGS. 13 to 21 are performed so as to collectively form a plurality of pieces of semiconductor laser chips.

Though N ions are also implanted into the contact layer 26 in this second modified example, the part of the contact layer 26 implanted with N ions is removed as being subjected to the etching processing as shown in FIGS. 13 to 16. Consequently, the window structure is prevented from altering its characteristics.

Third Modified Example

In the third modified example, the ion implantation and heat treatment shown in FIGS. 3 and 4 are omitted. Accordingly, in the steps shown in FIGS. 5, 7, 9, and 11, in the state where the ion implanted region X and the regions 14dis, 10dis, and 8dif caused by the enhanced diffusion are not formed, the stripe configurations of semiconductor laser shown in FIGS. 6, 8, 10, 12 are formed, respectively.

After the stripe configuration shown in FIG. 12 is provided, the p-type GaAs contact layer 26 is formed. Further, as shown in FIGS. 13 and 14, into an opening part obtained by etching the area of the contact layer 26 to be provided with a window structure, N ions are implanted, thereby forming the ion implanted region X. Further, a heat treatment forms the regions 14dis, 10dis, and 8dif caused by the enhanced diffusion. Then, after the ion implanted region X and the regions 14dis, 10dis, and 8dif caused by the enhanced diffusion are formed, the individual processing steps shown in FIGS. 15 to 21 are performed so as to collectively form a plurality of pieces of semiconductor laser chips.

As explained in the foregoing, according to the present invention, a window structure having a bandgap larger than that of the other part is formed at the light exit facet in a state where impurity atoms for forming the window structure are not diffused into the active layer, thereby allowing a semiconductor laser having high output and high reliability to be realized.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of making a semiconductor laser comprising:
   a first step of growing, in succession, on a semiconductor substrate of a first conductivity type, a lower cladding layer of said first conductivity type, an active layer having a quantum well structure, and an upper cladding layer of a second conductivity type, so as to yield a laminate structure;
   a second step of selectively implanting impurity atoms into a predetermined region of said laminate structure by ion implantation method so as to form an impurity implanted region implanted with said impurity atoms, said impurity implanted region extending from a surface of said laminate structure toward said active layer and being separated from said active layer by a predetermined distance;
   a third step of heat-treating said laminate structure under a condition where said impurity atoms fail to reach said active layer, so as to form a window structure; and
   a fourth step of cleaving said laminate structure at a position where said predetermined region exists, so as to yield a cleavage plane which becomes a light exit facet of said semiconductor laser.

2. The method according to claim 1, further comprising, between said third and fourth steps, a step of laminating a contact layer of said second conductivity type on said upper cladding layer excluding said predetermined region.

3. The method according to claim 1, further comprising, between said first and second steps, a step of laminating a second upper cladding layer of said second conductivity type on said upper cladding layer excluding said predetermined region.

4. The method according to claim 1, wherein said impurity atoms includes nitrogen.

5. The method according to claim 1, wherein said upper cladding layer is comprised of at least one of GaInP and AlGaInP.

6. The method according to claim 1, wherein, of said upper cladding layer, a part excluding at least said impurity implanted region or a part excluding at least both said impurity implanted region and a region between said impurity implanted region and active layer has a spontaneous ordering structure.

7. The method according to claim 1, wherein said upper cladding layer composes of a first upper cladding sublayer disposed on said active layer in direct contact therewith, and a second upper cladding sublayer disposed over said first upper cladding sublayer.

8. The method according to claim 1, wherein a well layer and a barrier layer which constitute said quantum well structure, and wherein at least said well layer is comprised of GaInAs.

9. The method according to claim 1, wherein the heat treatment in said third step is effected by lamp-annealing.

10. A semiconductor laser obtained by the method according to claim 1, said semiconductor laser comprising:
    a laminate structure having two cleavage planes which constitute a resonator, said laminate structure comprising a semiconductor substrate of a first conductivity type, a lower cladding layer of said first conductivity type disposed on said semiconductor substrate, an active layer which is disposed on said lower cladding layer and has a quantum well structure constituted by a quantum well layer and a barrier layer, and an upper cladding layer of a second conductivity type disposed on said active layer; and
    an impurity implanted region formed in a predetermined region of said upper cladding layer by ion implantation method, said impurity implanted region including at least one of said cleavage planes and being separated from said active layer by a predetermined distance.

11. The semiconductor laser according to claim 10, wherein said impurity implanted region extends from a surface of said upper cladding layer toward said active layer, said impurity implanted region having a bottom part separated from said active layer by a predetermined distance.

12. The semiconductor laser according to claim 10, wherein said upper cladding layer comprises a first upper cladding sublayer disposed on said active layer in direct contact therewith, and a second upper cladding sublayer disposed over said first upper cladding sublayer.

13. The semiconductor laser according to claim 10, further comprising a contact layer of said second conductivity type disposed on said upper cladding layer excluding said predetermined aregion.

14. The semiconductor laser according to claim 10, wherein said impurity includes nitrogen.

15. The semiconductor laser according to claim 10, wherein, of said upper cladding layer, a part excluding at least said impurity implanted region or a part excluding at least both said impurity implanted region and a region between said impurity implanted region and active layer has a spontaneous ordering structure.

16. The semiconductor laser according to claim 10, wherein said upper cladding layer is comprised of at least one of GaInP and AlGaInP.

17. The semiconductor laser according to claim 10, wherein said well layer is comprised of GaInAs.

* * * * *